United States Patent [19]

Velo

[11] Patent Number: 4,574,253

[45] Date of Patent: Mar. 4, 1986

[54] BROADBAND CONTROL AMPLIFIER

[75] Inventor: Henri J. Velo, Hilversum, Netherlands

[73] Assignee: U.S. Philips Corporation, New York, N.Y.

[21] Appl. No.: 700,380

[22] Filed: Feb. 11, 1985

[30] Foreign Application Priority Data

Feb. 14, 1984 [NL] Netherlands .......................... 8400463

[51] Int. Cl.[4] .............................................. H03F 1/34
[52] U.S. Cl. ....................................... 350/293; 330/99
[58] Field of Search ................. 330/99, 100, 293, 278, 330/126, 304

[56] References Cited

U.S. PATENT DOCUMENTS 4,219,788  8/1980  Cordell ................................ 330/304

Primary Examiner—James B. Mullins
Assistant Examiner—G. Wan
Attorney, Agent, or Firm—Thomas A. Briody; William J. Streeter; Leroy Eason

[57] ABSTRACT

Broadband control amplifier having a wide control range and comprising a differential amplifier in the negative feedback loop. An auxiliary coupling is provided in the feedback loop having a transfer factor which renders the open loop gain independent of the signal distribution in the differential amplifier. The control amplifier can, for example, be used as an input amplifier in a receiver for optical fibre systems, to compensate for the length and temperature-dependent attenuation of the optical link.

4 Claims, 6 Drawing Figures

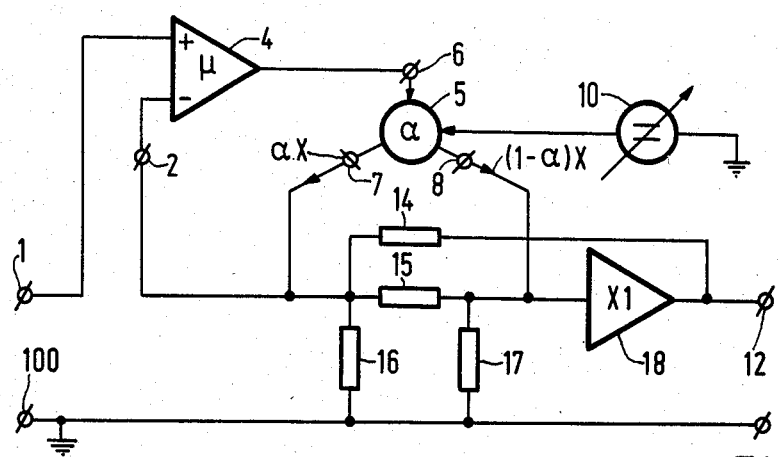
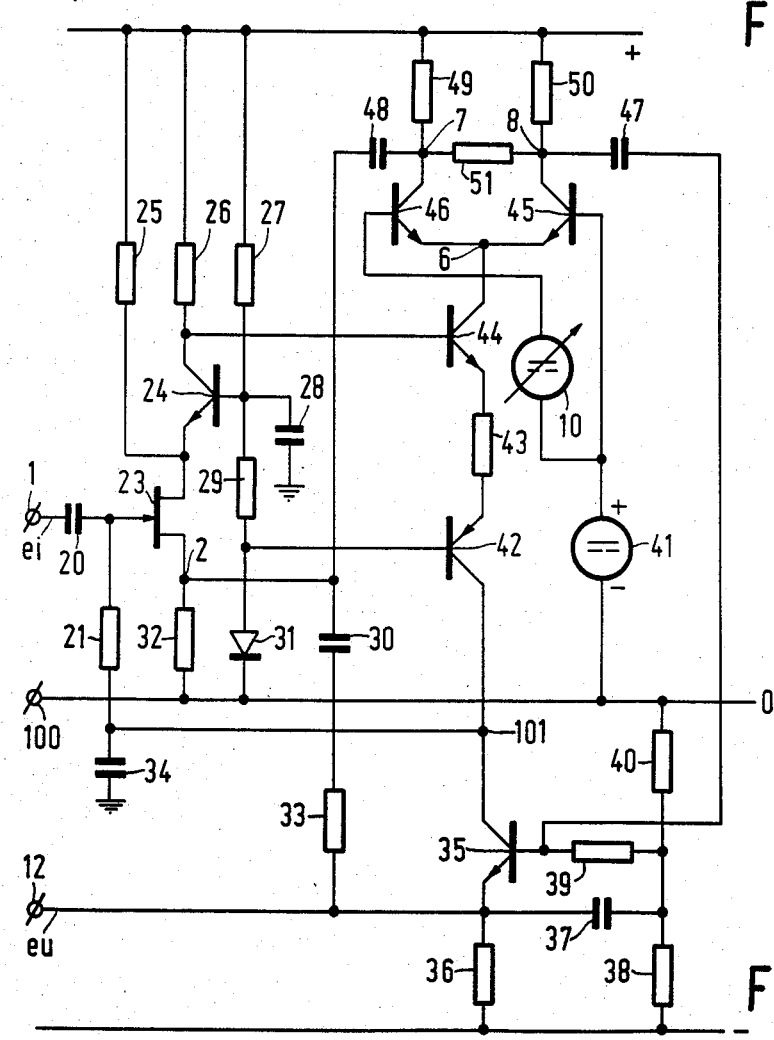
FIG.5
FIG.6

BROADBAND CONTROL AMPLIFIER

BACKGROUND OF THE INVENTION

1. Field of the Invention

The invention relates to a negative feedback broadband control amplifier of the kind comprising an amplifier (4) whose input is connected to the output of a differential combining circuit (3) and whose output is connected to the signal input (6) of a signal splitter (5) having a factor $\alpha$, a transfer first output (8) of the signal splitter (5) being coupled to the output terminal (12) of the control amplifier, a second output (7) of the signal splitter (5) being coupled via a network (11) to the output terminal (12) of the control amplifier and also to a subtractive first input (2) of the combining circuit (3), a second input of which is coupled to the input terminal (1) of the control amplifier.

Control amplifiers of this type can be used, for example as input amplifiers in a receiver for use in optical fibre systems, to compensate for the length and temperature dependent attenuation of the optical link.

2. Description of the Related Art

A control amplifier of such a type is disclosed in U.S. Pat. No. 4,219,788. This prior art control amplifier has the disadvantage that the open loop gain depends on the factor $\alpha$ of the signal splitter. This renders it impossible to produce a broadband control amplifier having a signal splitter in the negative feed back loop and having a wide control range.

SUMMARY OF THE INVENTION

The invention has for its object to provide a solution for the above problem. The invention is characterized in that at least one of the coupling paths of the first output (8) and the second output (7) of the signal splitter (5) comprises a network (13,50) to compensate for the influence of the factor $\alpha$ of the signal splitter on the open loop gain of the control amplifier.

BRIEF DESCRIPTION OF THE DRAWINGS

The invention will now be described in greater detail by way of example with reference to the accompanying drawings.

FIG. 5 shows a third embodiment of a control amplifier according to the invention.

FIG. 6 shows a detailed circuit diagram of an embodiment of the control amplifier shown in FIG. 5.

DESCRIPTION OF THE PREFERRED EMBODIMENTS

Figure 1:
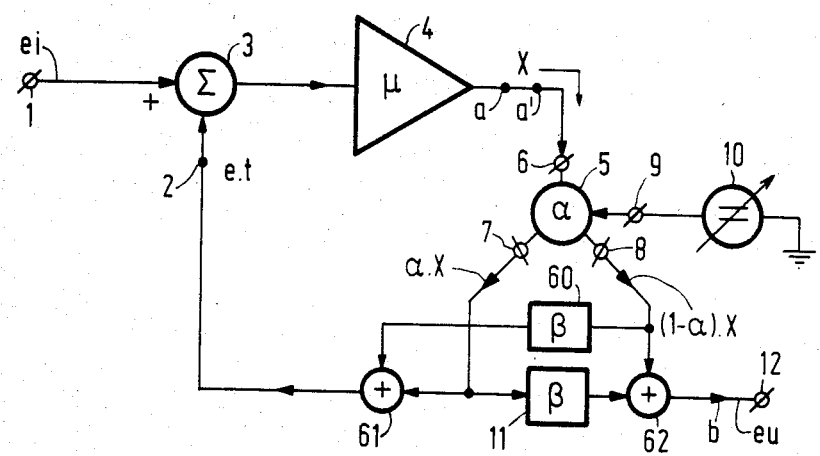
FIG. 1 shows a prior art control amplifier.

In FIG. 1, reference numeral 3 denotes a differential combining circuit whose additive input terminal is connected to the input 1 of the complete control amplifier. The output of the combining circuit is connected to the input of an amplifier 4. The output of the amplifier 4 is connected to the signal input 6 of a signal splitter 5. An output 7 of the signal splitter 5 is connected via a network 11 having a transfer factor $\beta(\beta<1)$ to an input of an adder circuit 62, whose output is connected to output terminal 12 of the complete control amplifier. A output 8 of the signal splitter 5 is connected to a further input of the adder circuit 62 and also via a network 60 having the transfer factor $\beta(\beta<1)$ to a second input of an adder circuit 61. A further input of the adder circuit 61 is connected to the output 7 of the signal splitter 5. The output of the adder circuit 61 is connected to the subtractive input 2 of the combining circuit 3. A control terminal 9 of the signal splitter 5 is connected to a source 10 supplying a variable control voltage.

In the embodiment shown in FIG. 1, $\alpha$ is the factor which in response to the control signal from the source 10 splits the output signal x of the amplifier 4 into a portion $\alpha \cdot x$ and $(1-\alpha) \cdot x$, where $0 \leq \alpha \leq 1$. If the gain u of the amplifier 4 is much greater than 1 then it holds with a proper approximation that the output signal eu of the control amplifier and the feedback signal et produced by adder circuit 61 are given by $$eu = (1-\alpha) \cdot x + \alpha \cdot \beta \cdot X \tag{1}$$

$$et = \alpha \cdot x + (1-\alpha) \cdot X \cdot \beta \approx ei \tag{2}$$

where ei is the input signal at input terminal 1. From this it follows that $$\frac{eu}{ei} = \frac{(1-\alpha) + \alpha \cdot \beta}{\alpha + (1-\alpha)\beta} \tag{3}$$

From the expression (3) it can be seen that:

$$eu/ei_{MAX} = 1/\beta(\alpha=0) \text{ and } eu/ei_{MIN} = \beta(\alpha=1) \tag{4}$$

The whole control range amounts to:

$$20 \log \frac{\left(\frac{eu}{ei}\right)_{MAX}}{\left(\frac{eu}{ei}\right)_{MIN}} = 20 \log \frac{1/\beta}{\beta} = 40 \log \frac{1}{\beta} \tag{5}$$

If the connection between a and a' in the output circuit of the amplifier 4 is interrupted then the gain between these points is equal to the open loop gain. This gain amounts to $$A(0) = u[\alpha + (1-\alpha)\beta] \tag{6}$$

Figure 2:
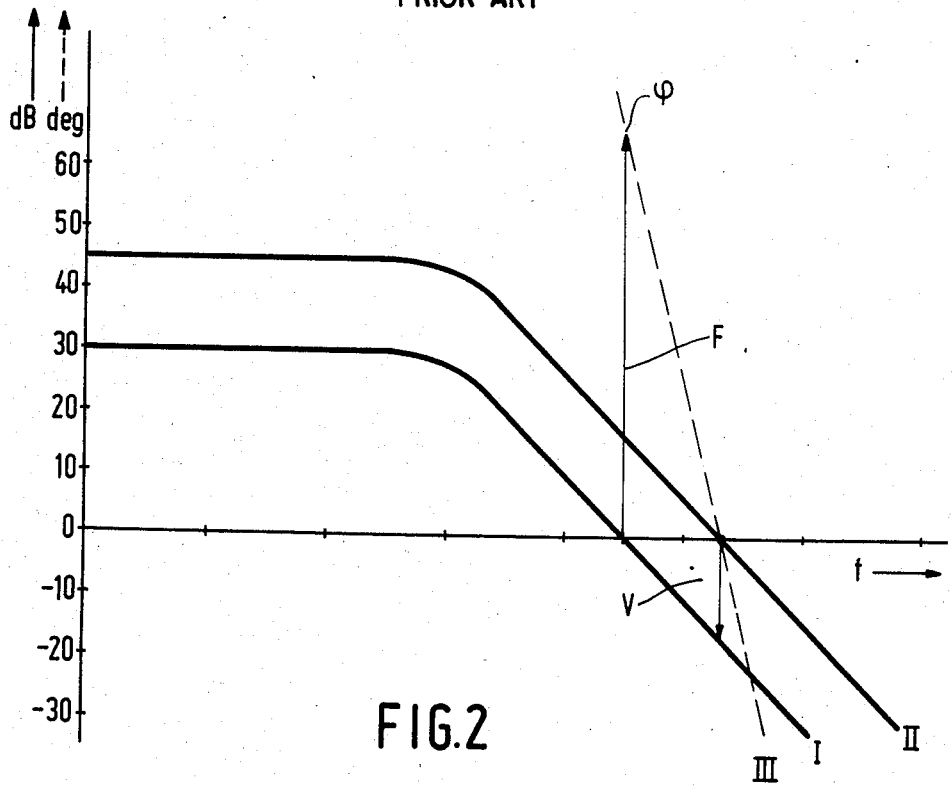
FIG. 2 shows a diagram to explain the operation of the control amplifier shown in FIG. 1.

FIG. 2 shows diagrammatically the variation of the open loop gain and the associated phase shift as a function of frequency of an amplifier based on the principle shown in FIG. 1. Line I holds for the case in which the factor $\alpha = 1$. The associated phase shift is represented by the line III. The Figure shows that in this situation the phase margin F is in this example $\approx 60°$ at an open loop gain of 0 dB and that the gain margin is $V \approx -13$ dB at a 0° phase shift. So in this situation the control amplifier is stable. When $\alpha = 0$ the open loop gain is represented by the line II. The associated phase shift continues to be the line III if it is assumed that this phase shift is completely produced in the amplifier 4 of FIG. 1. In this situation, with an open loop gain of 0 dB, the phase shift is 0°, causing the control amplifier to become unstable and to start oscillating. Consequently the control amplifier shown in FIG. 1 is not suitable for use as a broadband control amplifier having a wide control range.

Figure 3:
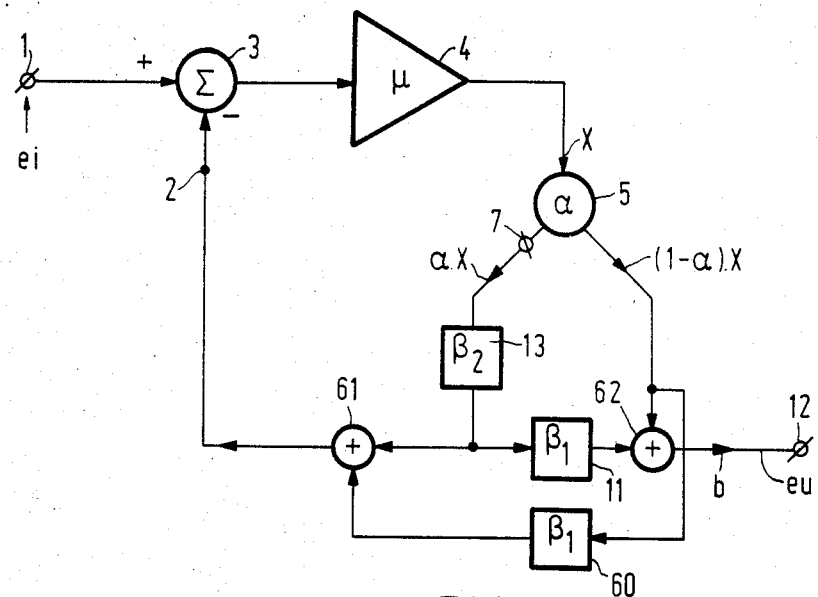
FIG. 3 shows a first embodiment of a control amplifier according to the invention.

FIG. 3 shows a circuit modification in accordance with the invention by means of which the open loop gain can be made independent of the signal splitter factor $\alpha$. To this end a network 13 is provided between the output 7 of the signal splitter 5 and the input 2 of the differential combining circuit 3. A simple calculation demonstrates that for the transfer function from the input 1 to the output 12 of the control amplifier the following relation holds:

$$eu/ei = \alpha \cdot \beta + (1-\alpha) \cdot 1/\beta) \qquad (7)$$

Substituting the values $\alpha=0$ and $\beta=1$, respectively demonstrates that the relation (4) also holds for this control amplifier. The open loop gain is now equal to $$A(0) = u[\alpha \cdot \beta_2 + (1-\alpha) \cdot \beta_1] = u[\alpha \cdot (\beta_2 + \beta_1) + \beta_1] \qquad (8)$$

For $\beta_2 = \beta_1 = \beta$, $A(0)$ is consequently equal to $\mu\beta$ and independent of the factor $\alpha$.

When the control amplifier of FIG. 3 is used to amplify or to attenuate a variable input level such that an output signal of a constant value is obtained, a signal equal to $ei(MAX) \cdot 1/\beta$ is present at the output 7 of the signal splitter 5 at the highest input level at the output 7. So this is $1/\beta$ times greater than the input signal, whilst the output signal amounts only to $ei(MAX) \cdot \beta$, and in principle causes an unnecessarily large drive in the control amplifier. To prevent, this then the network 13 having the transfer factor $\beta$ can be advantageously replaced by a network in the other branch of the signal splitter 5, which has a transfer factor $1/\beta$.

Figure 4:
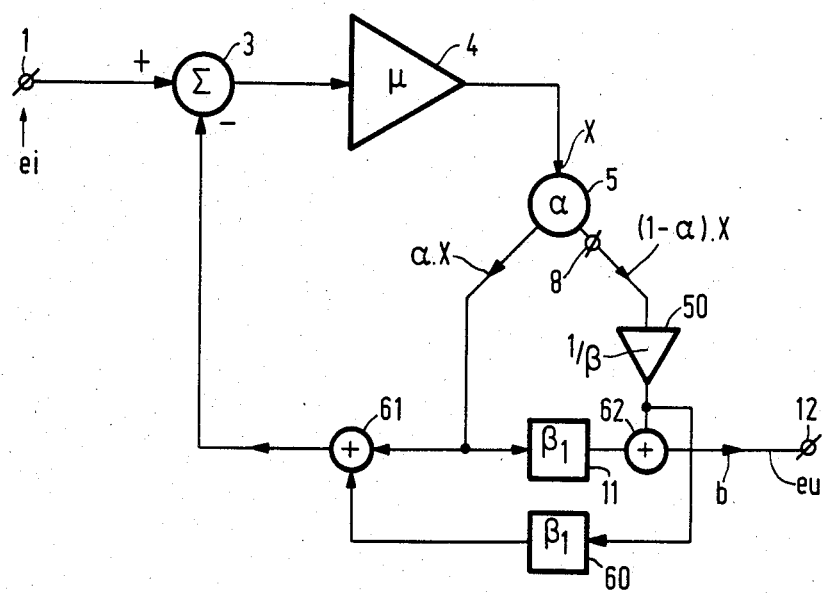
FIG. 4 shows a second embodiment of a control amplifier according to the invention.

This is shown in the embodiment of FIG. 4. A network 50 is now provided between the output 8 of the signal splitter 5 and the output 12 of the control amplifier. The transfer factor of the network 50 is closen to be equal to $1/\beta$. A simple calculation demonstrates that the relations (7) and (4) hold for the transfer function from the input 1 to the output 12 of the control amplifier. The open loop gain now amounts to $$A(0) = \mu[\alpha + (1-\alpha) \cdot \beta \cdot 1/\beta] = \mu \qquad (9)$$

and consequently is independent of the factor $\alpha$ of the signal splitter. However, the output impedance does depends on the factor $\alpha$. This may be objectionable for some applications.

FIG. 5 shows an embodiment in which both the open loop gain and the output impedance are independent of the factor $\alpha$. An amplifier 18, which has unity gain, is provided having an input impedance which is substantially $-\alpha$, whilst the output impedance is substantially equal to 0.

An inverting input 2 of the amplifier 4 is connected to the common junction of three resistors 14, 15, 16 and the output 7 of the signal splitter 5. A non-inverting input of the amplifier 4 is connected to the input terminal 1 of the complete control amplifier. The other terminal of the resistor 16 is connected to a point 100 of a constant potential. The other terminal of the resistor 15 is connected to the input of the amplifier 18 and also to the output 8 of the signal splitter 5. The resistor 17 is arranged between the input of the amplifier 18 and the point 100 of constant potential. The other terminal of the resistor 14 is connected to the output of the amplifier 18. The output 12 of the amplifier 18 is connected to the output terminal 12 of the complete control amplifier. If the following values are chosen for the resistors 14, 15, 16 and 17

14 = R, 15 = (n-1)R, 16 = R/n and 17 = R then a simple calculation shows that for the transfer function from the input terminal 1 to the output terminal 12 of the control amplifier the following relation holds $$eu/ei = \alpha \cdot n + (1-\alpha) \cdot 1/n \qquad (10)$$

If n is chosen to be equal to $\beta$, then the relation (10) is identical to the relation (7). Now however the output impedance is equal to 0 and so independent of $\alpha$. In addition, a simple calculation demonstrates that the open loop gain is defined by:

$$A(O) = \mu \cdot \frac{R}{n+1} \qquad (11)$$

and consequently is independent of the factor $\alpha$ of the signal splitter. The $\pi$ network formed by the resistors 15, 16 and 17 may of course alternatively be in the form of a T network.

In the embodiments shown in the FIGS. 3 to 5, inclusive the control ranges are symmetrical. This indicates that at one extreme position of the control range the circuits amplify to exactly the same extent as they attenuate at the other extreme position. In the circuits shown in FIGS. 3 and 4, the control range can be made asymmetrical by adding an additional negative feedback network. Such a feedback network can, for example, be arranged between the input 2 of the combining arrangement 3 and the network 11. In the circuit of FIG. 5 the control range can be made asymmetrical by choosing different relative resistance values of the resistors 14 to 17 from those indicated above.

FIG. 6 shows an detailed embodiment of the broadband control amplifier of FIG. 5. The input terminal 1 of the control amplifier is connected to the gate electrode of a field effect transistor 23 via a coupling capacitor 20. The gate electrode of the transistor 23 is connected to earth via the series arrangement of the resistor 21 and a capacitor 34. The source electrode 2 of transistor 23 is connected to the output terminal 12 of the control amplifier via a series arrangement of a coupling capacitor 30 and a resistor 33. The electrode 2 is also connected to ground via a resistor 32. The drain electrode of the field effect transistor 23 is connected to the positive line of the supply voltage via a resistor 25 and also to the emitter of a transistor 24. The collector of transistor 24 is connected to the base electrode of a transistor 44 and also to the positive line of the supply voltage via a resistor 26. The base electrode of the transistor 24 is connected to the positive line of the supply voltage via the resistor 27 and also to ground via the series arrangement of a resistor 29 and a diode 31. The base electrode of the transistor 24 is also connected to ground via a decoupling capacitor 28. The junction of the resistor 29 and the diode 31 is connected to the base electrode of a transistor 42, whose emitter is connected to the emitter of the transistor 44 via a resistor 43. The collector of the transistor 44 is connected to the common connection of the emitter electrodes of transistors 45 and 46. A variable voltage source 10 is arranged between the base electrode of the transistors 45 and 46. A d.c. voltage source 41 is connected between the base electrode of the transistor 45 and ground. The collector of the transistor 45 is connected to the positive line of the supply voltage via a resistor 50 and also to the base electrode of the transistor 35 via a coupling capacitor 47. The collector of the transistor 46 is connected via a resistor 49 to the positive line of the supply voltage and also via a coupling capacitor 48 to the source electrode of the transistor 23. A resistor 51 is provided between the collectors of the transistors 45 and 46. The collector of the transistor 42 is connected to the collector of a transistor 35 and also to the junction of the resistor 21 and the capacitor 34. The emitter of the transistor 35 is connected to the output terminal 12 of the control amplifier and also via a resistor 36 to the negative line of the supply voltage. The series arrangement of resistors 40 and 38 is provided between ground and the negative line of the supply voltage. The junction between the resistors 40 and 38 is connected via a resistor 39 to the base of the transistor 35 and also via a capacitor 37 to the emitter of the transistor 35.

The transistors 23, 24 and 44, the resistors. 25, 26, 27, 29, 32 and 43, the capacitor 28 and the diode 31 together form the amplifier 4 shown in FIG. 5. The transistors 45 and 46 together form the signal splitter 5 in FIG. 5. The transistor 35, the resistors 36, 38, 39 and 40 and the capacitors 34 and 37 together form the amplifier 18 of FIG. 5. The points 1, 2, 6, 7, 8 and output terminal 12 correspond to the same numbered points of the control amplifier shown in FIG. 5. Instead of the output terminal 12 the output signal of the broadband control amplifier may alternatively be taken from the collector of the transistor 35. In that case a resistor would be included between the point 101 and the collector of the transistor 35.

What is claimed is:

1. A broadband control amplifier, comprising an amplifier whose input is connected to the output of a differential combining circuit and whose output is connected to the signal input of a signal splitter having a transfer factor $\alpha$, a first output of the signal splitter producing an output signal equal to $(1-\alpha)$ times the input signal and which is coupled to the output terminal of the control amplifier, a second output of the signal splitter producing an output signal equal to $\alpha$ times the input signal and which is coupled by a first network to the output of the control amplifier and is further coupled to a first input of the differential combining circuit, a second input of the combining circuit being connected to the input terminal of the control amplifier, characterized in that at least one of the coupling paths of the first output and the second output of the signal splitter includes a second network to compensate for the influence of the transfer factor $\alpha$ of the signal splitter on the open loop gain of the control amplifier.

2. A broadband control amplifier as claimed in claim 1, characterized in that the second network is arranged between the second output of the signal splitter and the first input of the combining circuit, the transfer factor of the second network being substantially equal to the transfer factor of the first network.

3. A broadband control amplifier as claimed in claim 1, characterized in that the first output of the signal splitter is connected to the output of the control amplifier by a second amplifier, the second output of the signal splitter being connected by at least a first resistor to the output of the control amplifier, by at least a second resistor to the input of the second amplifier and by at least a third resistor to a point of constant potential, and the first output of the signal splitter being connected to a point of constant potential via at least a fourth resistor.

4. A broadband control amplifier as claimed in claim 3, characterized in that the second amplifier is an emitter follower transistor circuit.

* * * * *